United States Patent
Motomura et al.

(10) Patent No.: US 8,624,445 B2
(45) Date of Patent: Jan. 7, 2014

(54) STAGE APPARATUS

(75) Inventors: Youichi Motomura, Kitakyushu (JP);
Toshiyuki Kono, Kitakyushu (JP);
Yoshiaki Kubota, Kitakyushu (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 0 days.

(21) Appl. No.: 13/597,259

(22) Filed: Aug. 29, 2012

(65) Prior Publication Data

US 2012/0319505 A1  Dec. 20, 2012

Related U.S. Application Data

(63) Continuation of application No. PCT/JP2010/072858, filed on Dec. 20, 2010.

(30) Foreign Application Priority Data

Mar. 4, 2010 (JP) ................................. 2010-047382

(51) Int. Cl.
*H02K 41/02* (2006.01)

(52) U.S. Cl.
USPC ................... 310/12.05; 310/12.13; 310/12.15; 310/12.31; 310/12.33

(58) Field of Classification Search
CPC ........................................ H02K 41/00–41/065
USPC .......... 310/12.02, 12.05, 12.06, 12.07, 12.31, 310/12.13, 12.15, 12.33; 355/53
See application file for complete search history.

(56) References Cited

U.S. PATENT DOCUMENTS

| | | | | |
|---|---|---|---|---|
| 5,260,580 A | * | 11/1993 | Itoh et al. | 250/492.2 |
| 5,763,965 A | * | 6/1998 | Bader | 310/12.06 |
| 6,271,606 B1 | * | 8/2001 | Hazelton | 310/12.06 |
| 6,583,859 B2 | * | 6/2003 | Miyajima et al. | 355/72 |
| 6,665,053 B2 | * | 12/2003 | Korenaga | 355/72 |
| 6,671,036 B2 | * | 12/2003 | Kwan | 355/72 |
| 6,873,478 B2 | * | 3/2005 | Watson | 359/819 |
| 6,992,755 B2 | * | 1/2006 | Kubo | 355/72 |
| 7,262,524 B2 | * | 8/2007 | Takashima | 310/12.31 |
| 7,622,832 B2 | * | 11/2009 | Moriyama | 310/12.24 |
| 8,044,541 B2 | | 10/2011 | Toyota et al. | |

FOREIGN PATENT DOCUMENTS

| | | |
|---|---|---|
| JP | 2000-032733 | 1/2000 |
| JP | 2001-102279 | 4/2001 |
| JP | 2007-299925 | 11/2007 |
| JP | 2009-016678 | 1/2009 |

(Continued)

OTHER PUBLICATIONS

International Search Report for corresponding International Application No. PCT/JP2010/072858, Mar. 29, 2011.

(Continued)

*Primary Examiner* — Tran Nguyen
*Assistant Examiner* — Thomas Truong
(74) *Attorney, Agent, or Firm* — Ditthavong Mori & Steiner, P.C.

(57) ABSTRACT

This stage apparatus includes a movable table to hold a sample, a levitation unit to operate the movable table at least in a vertical direction, and a linear motor to operate the movable table in a first horizontal direction in a horizontal plane, including a linear motor movable element arranged inside the movable table and a linear motor stator arranged inside the movable table.

19 Claims, 8 Drawing Sheets

(56) References Cited

FOREIGN PATENT DOCUMENTS

| | | |
|---|---|---|
| JP | 2009-076521 | 4/2009 |
| JP | 2010-014250 | 1/2010 |
| WO | WO 01/03301 | 1/2000 |
| WO | WO 2004/105105 | 12/2004 |
| WO | WO 2009/128321 | 10/2009 |

OTHER PUBLICATIONS

Written Opinion for corresponding International Application No. PCT/JP2010/072858, Mar. 29, 2011.

* cited by examiner

STAGE APPARATUS

CROSS-REFERENCE TO RELATED APPLICATIONS

The priority application number JP2010-047382, Stage Apparatus, Mar. 4, 2010, Youichi Motomura, Toshiyuki Kono, and Yoshiaki Kubota, upon which this patent application is based is hereby incorporated by reference. This application is a continuation of PCT/JP2010/072858, Stage Apparatus, Dec. 20, 2010, Youichi Motomura, Toshiyuki Kono, and Yoshiaki Kubota.

BACKGROUND OF THE INVENTION

1. Field of the Invention

The present invention relates to a stage apparatus, and more particularly, it relates to a stage apparatus moving a sample in a prescribed direction in a horizontal plane by a linear motor.

2. Description of the Background Art

In general, a stage apparatus moving a sample in a prescribed direction in a horizontal plane by a linear motor is known. Such a stage apparatus moving a sample in a prescribed direction in a horizontal plane by a linear motor is disclosed in Japanese Patent Laying-Open No. 2001-102279, for example.

In Japanese Patent Laying-Open No. 2001-102279, there is disclosed a reticle stage (stage apparatus) including a reticle fine movement stage (movable table) holding a reticle (sample), driven finely in a horizontal plane and a reticle rough movement stage arranged below the reticle fine movement stage. This reticle rough movement stage is driven with a movement amount larger than that of the reticle fine movement stage in a Y-axis direction in the horizontal plane. In the reticle stage according to Japanese Patent Laying-Open No. 2001-102279, a pair of linear motors to drive the reticle rough movement stage in the Y-axis direction are provided. The pair of linear motors are arranged outside the reticle rough movement stage to hold the reticle rough movement stage therebetween.

However, in Japanese Patent Laying-Open No. 2001-102279, the linear motors to move the reticle (sample) in the Y-axis direction in the horizontal plane are arranged outside the reticle rough movement stage to hold the reticle rough movement stage therebetween, and hence an arrangement space for the linear motors is required outside an arrangement space for the reticle rough movement stage, so that there is such inconvenience that the reticle stage (stage apparatus) increases in size. Therefore, it is difficult to downsize the stage apparatus (reticle stage) in Japanese Patent Laying-Open No. 2001-102279.

SUMMARY OF THE INVENTION

The present invention has been proposed in order to solve the aforementioned problem, and an object of the present invention is to provide a stage apparatus capable of being downsized.

In order to attain the aforementioned object, a stage apparatus according to an aspect of the present invention includes a movable table to hold a sample, a levitation unit to operate the movable table at least in the vertical direction, including a levitation unit movable element and a levitation unit stator, and a linear motor to operate the movable table in a first horizontal direction in a horizontal plane, including a linear motor movable element arranged inside the movable table and a linear motor stator arranged inside the movable table.

In the stage apparatus according to the aspect of the present invention, as hereinabove described, the linear motor to operate the movable table in the first horizontal direction in the horizontal plane is provided, and the linear motor movable element and the linear motor stator of the linear motor are arranged inside the movable table. Thus, no arrangement space for the linear motor may be provided outside an arrangement space for the movable table, dissimilarly to a case where the linear motor movable element and the linear motor stator are arranged outside the movable table, and hence the outside dimension of the stage apparatus in the horizontal direction can be reduced. Consequently, the stage apparatus can be downsized.

DESCRIPTION OF THE EMBODIMENTS

Embodiments are now described on the basis of the drawings.

(First Embodiment)

The structure of a magnetic levitation table apparatus 100 including a stage apparatus 1 according to a first embodiment is described with reference to FIGS. 1 to 6.

The magnetic levitation table apparatus 100 is employed in an exposure apparatus developing a circuit pattern into a semiconductor substrate. The magnetic levitation table apparatus 100 includes the stage apparatus 1, an anti-vibration table 2 for a stage apparatus supporting the stage apparatus 1, and an anti-vibration table 3 for a laser interferometer, as shown in FIGS. 1 and 2.

Figure 1:
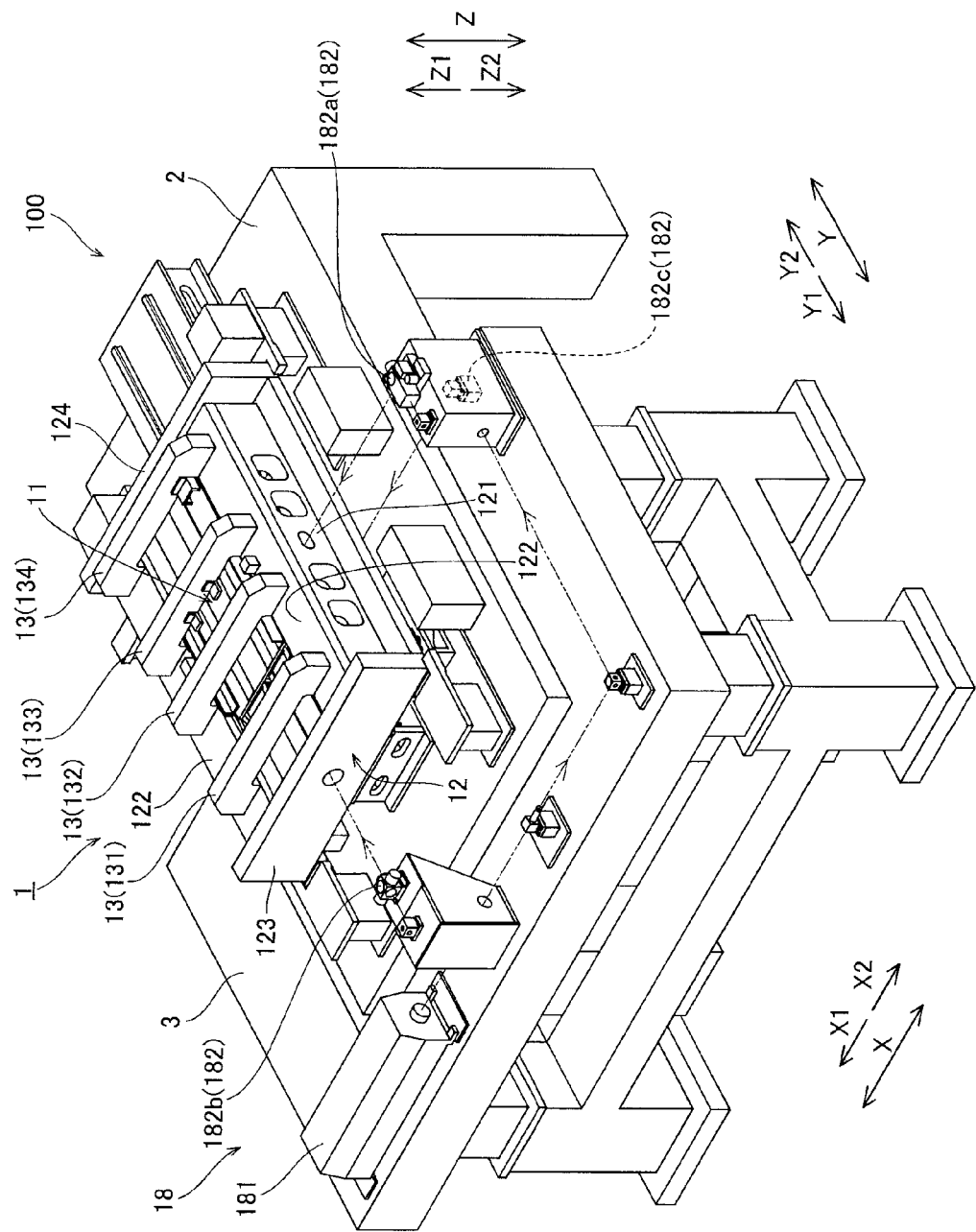
FIG. 1 is a perspective view showing the overall structure of a magnetic levitation table apparatus including a stage apparatus according to a first embodiment.
Figure 2:
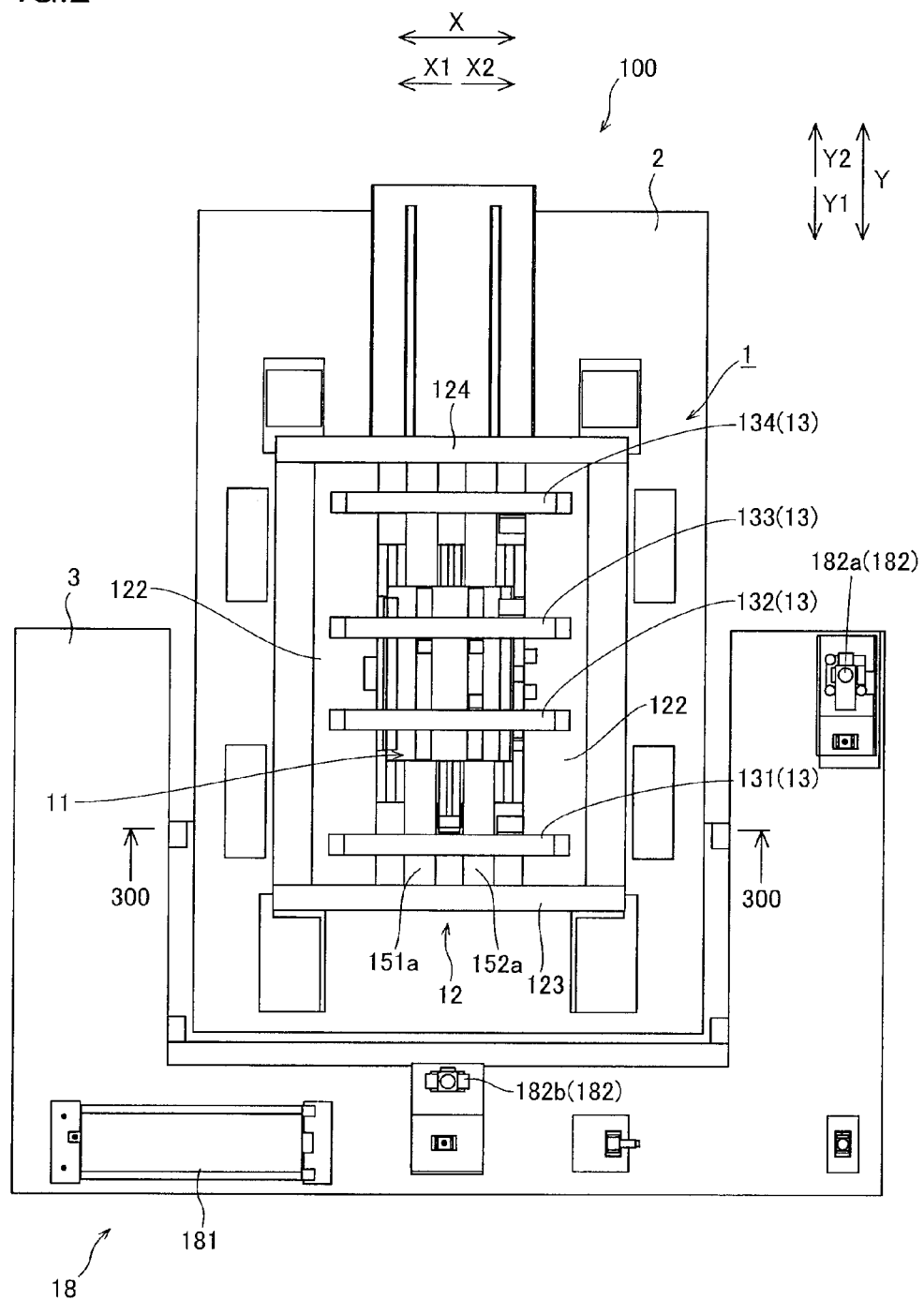
FIG. 2 is a plan view showing the overall structure of the magnetic levitation table apparatus including the stage apparatus according to the first embodiment.
Figure 4:
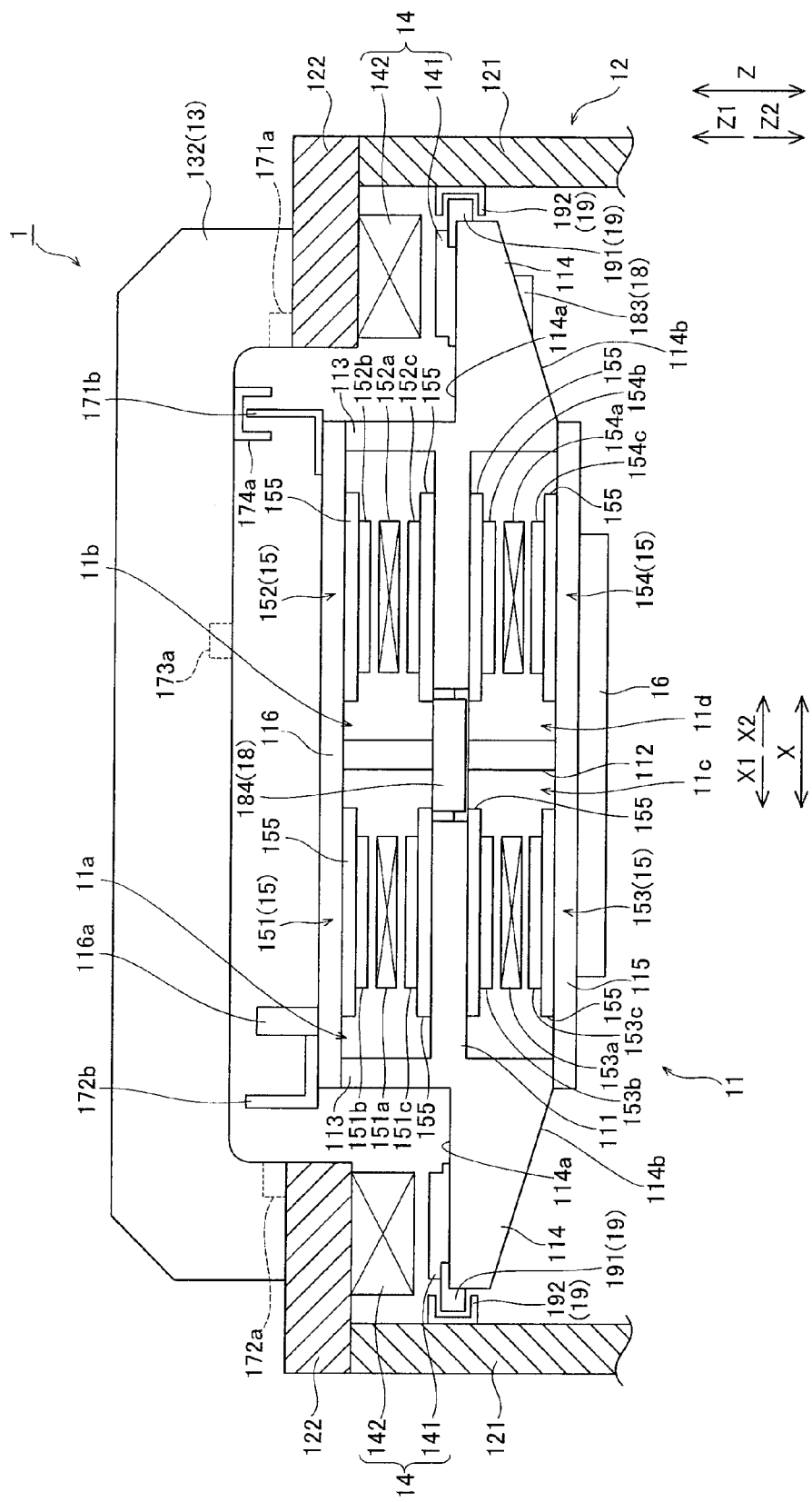
FIG. 4 is a sectional view taken along the line 300-300 in FIG. 2.

The stage apparatus 1 includes a movable table 11, a stage fixed portion 12 surrounding the movable table 11 in a direction X and a direction Y, and a fixed frame 13 provided above (direction Z1) the movable table 11, as shown in FIGS. 1, 2, and 4. The stage apparatus 1 further includes magnetic levitation units 14 each having a function of operating the movable table 11 in the direction X and a direction Z and linear motor units 15 each having a function of operating the movable table 11 in the direction Y, as shown in FIG. 4. The stage apparatus 1 is arranged on the upper surface of the anti-vibration table 2 for a stage apparatus. The stage fixed portion 12 is an example of the "stator supporting member", and the magnetic levitation units 14 are examples of the "levitation unit".

The movable table 11 has a function of holding a mask (photomask) 16 (see FIG. 4) to transfer a circuit pattern on the lower surface thereof. The movable table 11 is configured to be capable of operating in six directions of the direction X in the horizontal plane, the direction Y orthogonal to the direction X in the horizontal plane, the vertical direction (direction Z), a direction about an X axis (θx), a direction about a Y axis (θy), and a direction about a Z axis (θz), as described later. In other words, the movable table 11 is configured to be capable of being controlled with six degrees of freedom. Thus, the mask 16 held on the lower surface of the movable table 11 can be moved with six degrees of freedom. The mask 16 is an example of the "sample".

Figure 3:
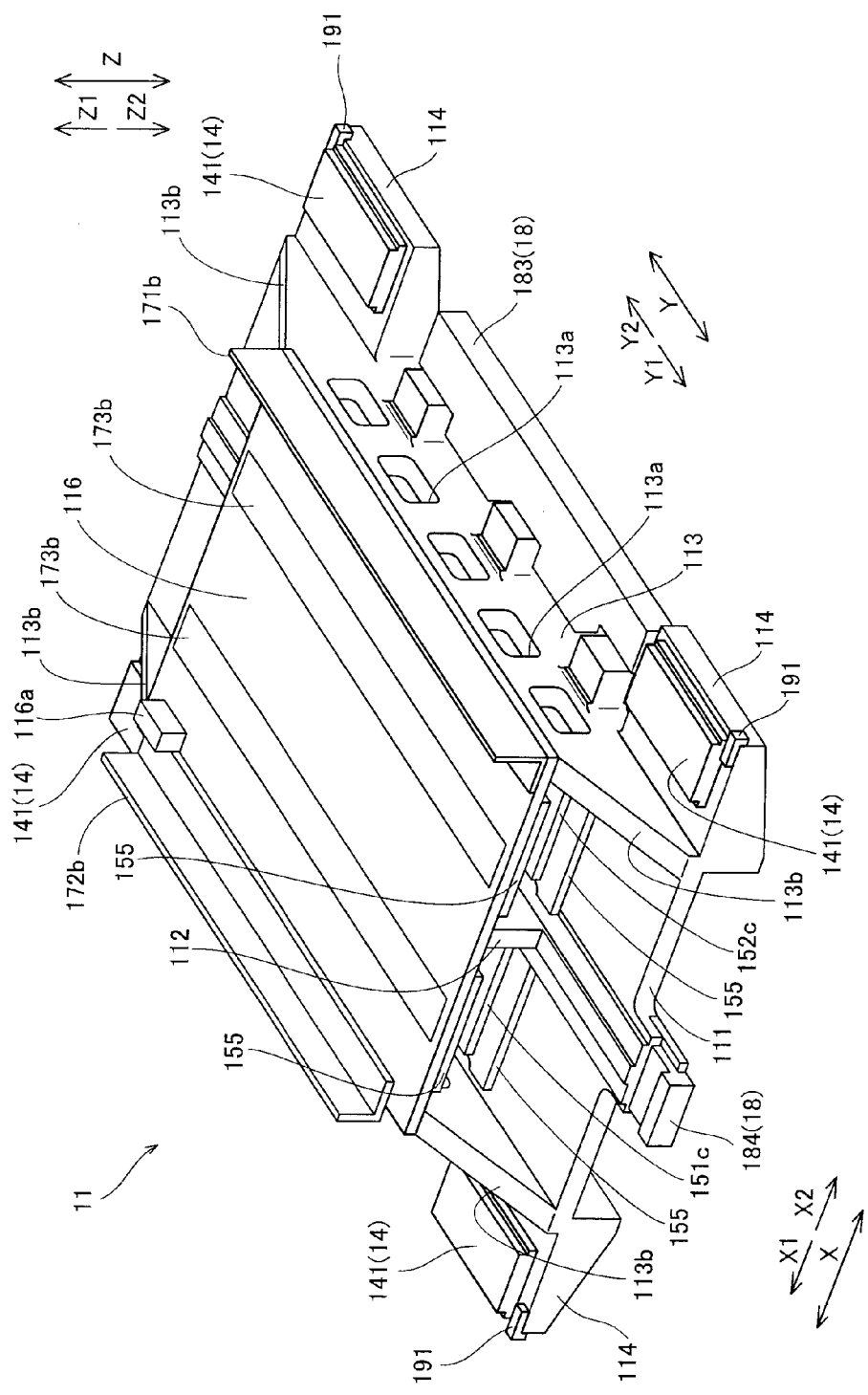
FIG. 3 is a perspective view showing a movable table of the stage apparatus according to the first embodiment.

As shown in FIGS. 3 and 4, the movable table 11 has a horizontal divider 111 extending in the direction X and a vertical divider 112 orthogonal to the horizontal divider 111 at a central portion of the horizontal divider 111 in the direction X, as viewed from the direction Y. A pair of side wall portions 113 are provided on both end portions of the horizontal divider 111 in the direction X. Flange portions 114 protruding outward in the direction X are formed on the outer surface of a lower portion of each of the pair of side wall portions 113. The horizontal divider 111, the vertical divider 112, the side wall portions 113, and the flange portions 114 are made of a lightweight ceramic member having high specific stiffness, and formed integrally with each other. The horizontal divider 111, the vertical divider 112, the side wall portions 113, and the flange portions 114 constitute a movable portion main frame. The flange portions 114 are examples of the "protrusion portion".

The horizontal divider 111 is in the form of a flat plate arranged horizontally, as shown in FIG. 3. The horizontal divider 111 is formed to extend in the direction Y. The vertical divider 112 is in the form of a flat plate arranged vertically. The vertical divider 112 is formed to extend in the direction Y. As shown in FIGS. 3 and 4, the horizontal divider 111 and the vertical divider 112 are arranged to be orthogonal to each other at the central portion, as viewed from the direction Y. The movable table 11 is so configured that the center of gravity thereof is located at an intersection portion of the horizontal divider 111 and the vertical divider 112, as described later.

The pair of side wall portions 113 each are in the form of a flat plate arranged vertically, and arranged parallel to the vertical divider 112, as shown in FIGS. 3 and 4. The pair of side wall portions 113 are formed to extend in the direction Y. As shown in FIG. 3, the side wall portions 113 are formed with a plurality of openings 113a. Thus, the weight of the side wall portions 113 can be reduced to reduce the weight of the movable table 11. The pair of side wall portions 113 are provided with inclined portions 113b whose upper portions are inclined downward and outward on both end portions of the pair of side wall portions 113 in the direction Y, as viewed from the direction X.

Figure 5:
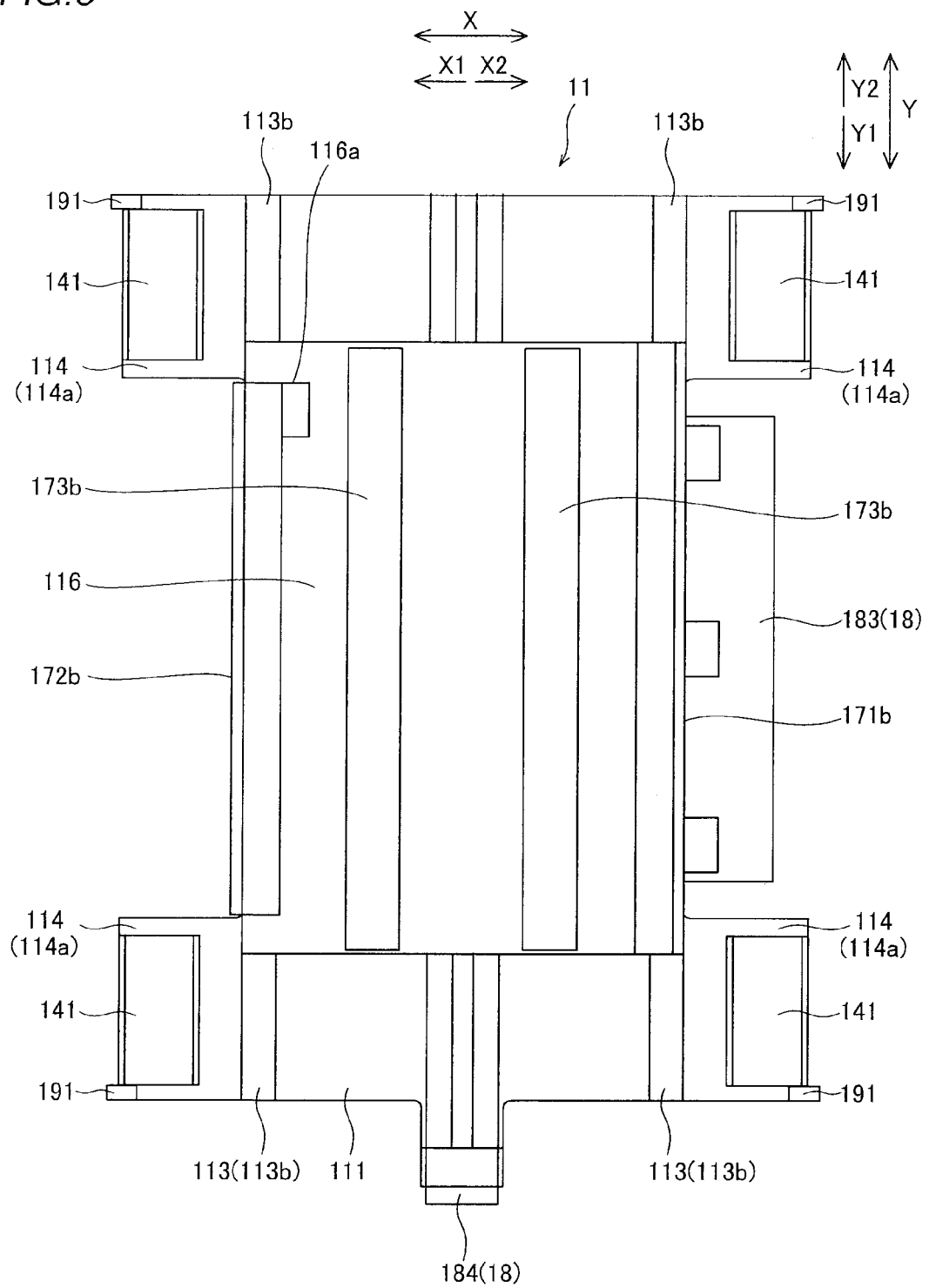
FIG. 5 is a plan view showing the movable table of the stage apparatus according to the first embodiment.

The two flange portions 114 are provided on each of the pair of side wall portions 113, as shown in FIGS. 3 and 5. In other words, the two flange portions 114 protruding in the direction X1 are provided on the outer surface (surface in the direction X1) of the side wall portion 113 in the direction X1, and the two flange portions 114 protruding in the direction X2 are provided on the outer surface (surface in the direction X2) of the side wall portion 113 in the direction X2. The two flange portions 114 in the direction X1 (direction X2) are arranged in the vicinity of both end portions in the direction Y of the side wall portion 113 in the direction X1 (direction X2). The four flange portions 114 are provided on lower portions of the side wall portions 113, as shown in FIG. 4. Specifically, the upper surfaces 114a (surfaces in the direction Z1) of the four flange portions 114 are formed horizontally, and arranged at a height substantially equal to that of the intersection portion of the horizontal divider 111 and the vertical divider 112, at which the center of gravity of the movable table 11 is located, in the vertical direction (direction Z). The flange portions 114 each have such a shape that the vertical height thereof gradually increases from the outside toward a base thereof. In other words, the lower surfaces 114b of the flange portions 114 each are formed in the form of an inclined surface inclined obliquely downward from the outside toward the base. Thus, the section stiffness of the flange portions 114 in the vicinity of the bases can be increased, and hence the flange portions 114 can be inhibited from warping in the vertical direction.

As shown in FIG. 4, a lower frame 115 is provided on the lower side of the vertical divider 112 and the pair of side wall portions 113, and an upper frame 116 is provided on the upper side of the vertical divider 112 and the pair of side wall portions 113. The lower frame 115 is mounted with unshown bolts to come into contact with the lower surfaces (surfaces in the direction Z2) of the vertical divider 112 and the pair of side wall portions 113. The upper frame 116 is mounted with unshown bolts to come into contact with the upper surfaces (surfaces in the direction Z1) of the vertical divider 112 and the pair of side wall portions 113. The lower frame 115 and the upper frame 116 are made of a ceramic member. The lower frame 115 and the upper frame 116 are in the form of a flat plate arranged horizontally. Furthermore, the lower frame 115 and the upper frame 116 are formed to extend in the direction Y, and each have a length shorter than that of the horizontal divider 111 in the direction Y. On the lower surface (surface in the direction Z2) of the lower frame 115, the mask 16 in the form of a flat plate is held by an electrostatic chuck, as shown in FIG. 4. On the upper surface (surface in the direction Z1) of the upper frame 116, an adjustment weight 116a to finely adjust the position of the center of gravity of the movable table 11 so that the same is located at the intersection portion of the horizontal divider 111 and the vertical divider 112 is mounted, as shown in FIGS. 3 to 5.

The lower frame 115, the upper frame 116, and the pair of side wall portions 113 constitute a frame-shaped portion surrounding the horizontal divider 111 and the vertical divider 112 in the form of a frame. A space surrounded by the lower frame 115, the upper frame 116, and the pair of side wall portions 113 is formed to arrange the linear motor units 15, and divided into four latticed motor placement spaces 11a to 11d by the horizontal divider 111 and the vertical divider 112. In other words, the four motor placement spaces 11a to 11d to arrange the linear motor units 15 are formed in an internal portion of the movable table 11.

As shown in FIGS. 1 and 2, the stage fixed portion 12 is formed in the form of a frame to surround the periphery of the movable table 11 in plan view. Furthermore, the stage fixed portion 12 has side surface portions 121 arranged on both sides of the movable table 11 in the direction X, two flat upper surface portions 122 arranged on the upper side of the side surface portions 121, a front surface portion 123 (see FIGS. 1 and 2) arranged in the direction Y1 with respect to the movable table 11, and a rear surface portion 124 (see FIGS. 1 and 2) arranged in the direction Y2 with respect to the movable table 11, as shown in FIG. 4. The side surface portions 121 each are in the form of a flat plate arranged vertically, and formed to extend in the direction Y, as shown in FIG. 1. The two upper surface portions 122 each are in the form of a flat plate arranged horizontally, and formed at a prescribed interval in the direction X to extend in the direction Y, as shown in FIGS. 1, 2, and 4. Furthermore, the two upper surface portions 122 are arranged above the flange portions 114 of the movable table 11 to overlap the flange portions 114 in plan view, as shown in FIG. 4. The front surface portion 123 and the rear surface portion 124 each are in the form of a flat plate arranged vertically, and formed to extend in the direction X. The stage fixed portion 12 serves as a counter mass to prevent the influence of reaction force generated when the movable table 11 operates from being transmitted to the anti-vibration table 2 for a stage apparatus.

The fixed frame 13 has four frames of a first fixed frame 131, a second fixed frame 132, a third fixed frame 133, and a fourth fixed frame 134 successively from a Y1 side, as shown in FIGS. 1 and 2. The fixed frames 131 to 134 each are arranged to stride across the movable table 11, as shown in FIG. 4. Specifically, the fixed frames 131 to 134 each are fixedly mounted on the upper surfaces (surfaces in the direction Z1) of the upper surface portions 122 arranged on both sides of the movable table 11 in the direction X. The fixed frames 131 to 134 each are in the form of a flat plate arranged vertically, and formed to extend in the direction X. The first fixed frame 131 arranged foremost in the direction Y1 is arranged in the vicinity of a movable limit position of the movable table 11 on the Y1 side. The fourth fixed frame 134 arranged foremost in the direction Y2 is arranged in the vicinity of a movable limit position of the movable table 11 on the Y2 side.

The magnetic levitation units 14 are constituted by levitation unit movable elements 141 and levitation unit stators 142. The levitation unit movable elements 141 are placed on the upper surfaces 114a of the four flange portions 114, as shown in FIGS. 3 and 5. The levitation unit movable elements 141 are formed of a plurality of permanent magnets. The levitation unit stators 142 are mounted on the lower surfaces (surfaces in the direction Z2) of the upper surface portions 122 arranged on both sides of the movable table 11 to extend in the direction Y, as shown in FIG. 4. Furthermore, the levitation unit stators 142 are formed of two types of coils that are an unshown X-direction driving coil and an unshown Z-direction driving coil. Thus, the magnetic levitation units 14 can generate thrust of two axes in the direction X and the direction Z. The levitation unit movable elements 141 are so arranged that the action center position of the thrust in the direction X of the magnetic levitation units 14 is positioned at the same height as the center of gravity of the movable table 11 in the vertical direction (direction Z). The four magnetic levitation units 14 are arranged to surround the center of gravity of the movable table 11 in plan view (as viewed from the direction Z).

The magnetic levitation units 14 can operate the movable table 11 in the direction X and the direction about the Z axis ($\theta z$) by controlling the thrust of each of the levitation unit movable elements 141 in the direction X. Furthermore, the magnetic levitation units 14 can operate the movable table 11 in the direction Z, the direction about the X axis ($\theta x$), and the direction about the Y axis ($\theta y$) by controlling the thrust of each of the levitation unit movable elements 141 in the direction Z. As the magnetic levitation units 14, a multi-degree-of-freedom actuator described in Patent Document WO2009/128321A1 or the like can be employed.

The linear motor units 15 are provided to operate the movable table 11 in the direction Y. The linear motor units 15 each are constituted by four linear motors 151, 152, 153, and 154, as shown in FIG. 4. The linear motors 151 to 154 are arranged in two stages in the vertical direction (direction Z) and in two rows in the direction X, and provided in the four latticed motor placement spaces 11a to 11d in the internal portion of the movable table 11.

Specifically, the linear motor 151 is arranged in the motor placement space 11a on the upper side (Z1 side) of the horizontal divider 111 and the X1 side of the vertical divider 112, of the four latticed motor placement spaces 11a to 11d, as shown in FIG. 4. The linear motor 152 is arranged in the motor placement space 11b on the upper side (Z1 side) of the horizontal divider 111 and the X2 side of the vertical divider 112. The linear motor 153 is arranged in the motor placement space 11c on the lower side (Z2 side) of the horizontal divider 111 and the X1 side of the vertical divider 112. The linear motor 154 is arranged in the motor placement space 11d on the lower side (Z2 side) of the horizontal divider 111 and the X2 side of the vertical divider 112. In other words, the linear motors 151 to 154 are arranged to surround the center of gravity of the movable table 11 located at the intersection portion of the horizontal divider 111 and the vertical divider 112. Furthermore, the linear motors 151 to 154 are arranged to be centrally symmetric with respect to the center of gravity of the movable table 11. Thus, the action center positions of the thrust in the direction Y of the linear motors 151 to 154 are at a height equal to that of the center of gravity of the movable table 11 in the vertical direction (direction Z).

Next, the specific structure of the linear motors 151, 152, 153, and 154 is described. The linear motors 151, 152, 153, and 154 have linear motor stators 151a, 152a, 153a, and 154a each formed of a coil, respectively. The linear motors 151, 152, 153, and 154 further have upper linear motor movable elements 151b, 152b, 153b, and 154b each formed of a permanent magnet and lower linear motor movable elements 151c, 152c, 153c, and 154c each formed of a permanent magnet, respectively.

The linear motors 151, 152, 153, and 154 are examples of the "first linear motor", the "second linear motor", the "third linear motor", and the "fourth linear motor", respectively. The linear motor stators 151a, 152a, 153a, and 154a are examples of the "first linear motor stator", the "second linear motor stator", the "third linear motor stator", and the "fourth linear motor stator", respectively. The upper linear motor movable elements 151b, 152b, 153b, and 154b are examples of the "fifth linear motor movable element", the "sixth linear motor movable element", the "third linear motor movable element", and the "fourth linear motor movable element", respectively. The lower linear motor movable elements 151c, 152c, 153c, and 154c are examples of the "first linear motor movable element", the "second linear motor movable element", the "seventh linear motor movable element", and the "eighth linear motor movable element", respectively.

Figure 6:
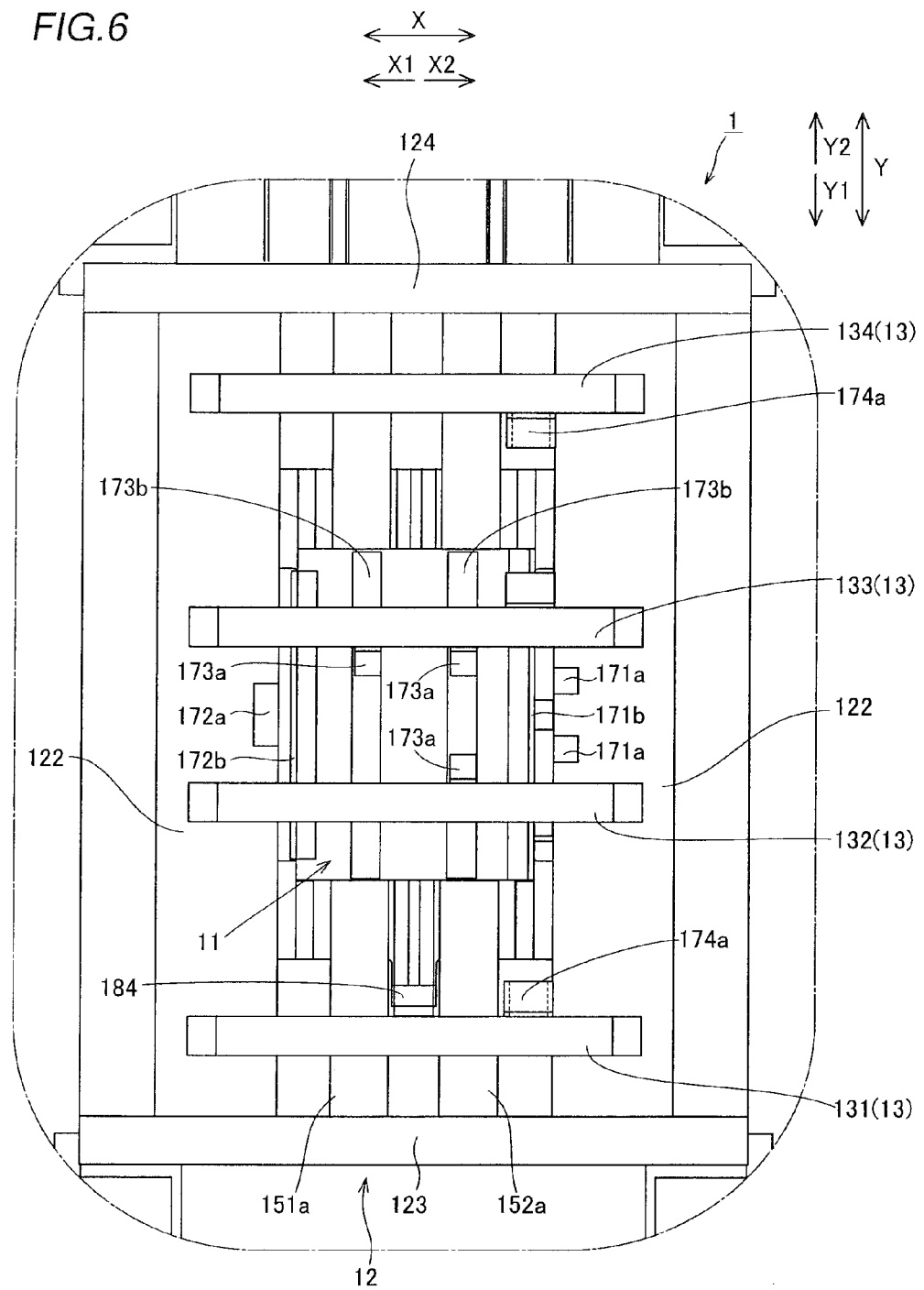
FIG. 6 is a plan view showing the stage apparatus according to the first embodiment.

The linear motor stators 151a to 154a are formed to extend in the direction Y. Furthermore, the linear motor stators 151a to 154a are arranged to penetrate the movable table 11 through substantially central portions of the latticed motor placement spaces 11a to 11d where the linear motor stators 151a to 154a are arranged, as shown in FIG. 4. Specifically, the end portions of the linear motor stators 151a to 154a in the direction Y1 are supported by the front surface portion 123 of the stage fixed portion 12 outside the movable table 11, while the end portions thereof in the direction Y2 are supported by the rear surface portion 124 of the stage fixed portion 12 outside the movable table 11, as shown in FIG. 6.

The upper linear motor movable elements 151b to 154b and the lower linear motor movable elements 151c to 154c are formed to extend in the direction Y. The lower linear motor movable element 151c of the linear motor 151 and the lower linear motor movable element 152c of the linear motor 152 are placed on the upper surface of the horizontal divider 111 through yokes 155 to be opposed to the lower surfaces of the linear motor stators 151a and 152a, respectively. The upper linear motor movable element 151b of the linear motor 151 and the upper linear motor movable element 152b of the linear motor 152 are placed on the lower surface of the upper frame 116 through yokes 155 to be opposed to the upper surfaces of the linear motor stators 151a and 152a, respectively.

The linear motors 153 and 154 are similar in structure to the linear motors 151 and 152. Specifically, the upper linear motor movable element 153b of the linear motor 153 and the upper linear motor movable element 154b of the linear motor 154 are placed on the lower surface of the horizontal divider 111 through yokes 155 to be opposed to the upper surfaces of the linear motor stators 153a and 154a, respectively. The lower linear motor movable element 153c of the linear motor 153 and the lower linear motor movable element 154c of the linear motor 154 are placed on the upper surface of the lower frame 115 through yokes 155 to be opposed to the lower surfaces of the linear motor stators 153a and 154a, respectively.

According to the first embodiment, the operating state of the movable table 11 is detectable by a plurality of sensors and a laser interferometer system 18. Next, the plurality of sensors and the laser interferometer system 18 detecting the operating state of the movable table 11 are described.

Two X-direction gap sensors 171a are provided on the upper surface of the upper surface portion 122 of the stage fixed portion 12 on the X2 side, as shown in FIGS. 4 and 6. The X-direction gap sensors 171a are downsized eddy current sensors. As shown in FIGS. 3 to 6, an X-direction target 171b made of metal is mounted on the upper surface of the upper frame 116 of the movable table 11. The X-direction target 171b has an L-shaped section, and is formed to extend in the direction Y. The X-direction target 171b is arranged along the edge of the upper frame 116 on the X2 side. The X-direction target 171b is so mounted that the lower surface of a horizontal portion thereof comes into contact with the upper surface of the upper frame 116, and so configured that the surface of a vertical portion thereof on the X2 side is opposed to the two X-direction gap sensors 171a. In other words, the surface of the vertical portion of the X-direction target 171b on the X2 side serves as a reference surface for detection by the X-direction gap sensors 171a. These X-direction gap sensors 171a and X-direction target 171b detect displacement of the movable table 11 in the direction X.

As shown in FIGS. 4 and 6, a Y-direction sensor head 172a is provided on the upper surface of the upper surface portion 122 of the stage fixed portion 12 on the X1 side. The Y-direction sensor head 172a is for a linear scale. As shown in FIGS. 3 to 6, a linear scale target 172b is mounted on the upper surface of the upper frame 116 of the movable table 11. The linear scale target 172b has an L-shaped section, and is formed to extend in the direction Y. The weight of the linear scale target 172b is larger than that of the X-direction target 171b. The linear scale target 172b is arranged along the edge of the upper frame 116 on the X1 side. The linear scale target 172b is so mounted that the lower surface of a horizontal portion thereof comes into contact with the upper surface of the upper frame 116, and so configured that the surface of a vertical portion thereof on the X1 side is opposed to the Y-direction sensor head 172a. These Y-direction sensor head 172a and linear scale target 172b detect displacement of the movable table 11 in the direction Y.

As shown in FIGS. 4 and 6, a Z-direction gap sensor 173a is provided on the surface of the second fixed frame 132 on the Y2 side. Furthermore, two Z-direction gap sensors 173a are provided on the surface of the third fixed frame 133 on the Y1 side, as shown in FIG. 6. As shown in FIGS. 3, 5, and 6, two Z-direction targets 173b are mounted on the upper surface of the upper frame 116 of the movable table 11. The two Z-direction targets 173b are arranged parallel at a prescribed interval in the direction X to extend in the direction Y. The Z-direction targets 173b are arranged below the Z-direction gap sensors 173a. In other words, the upper surfaces of the Z-direction targets 173b serve as reference surfaces for detection by the Z-direction gap sensors 173a. These Z-direction gap sensors 173a and Z-direction targets 173b detect displacement of the movable table 11 in the direction Z.

As shown in FIG. 6, limit sensors 174a are mounted on the surface of the first fixed frame 131 on the Y2 side and the surface of the fourth fixed frame 134 on the Y1 side. The limit sensor 174a on the first fixed frame 131 is provided to detect the movable limit position of the movable table 11 on the Y1 side. The limit sensor 174a on the fourth fixed frame 134 is provided to detect the movable limit position of the movable table 11 on the Y2 side. The limit sensors 174a are laser transmission sensors. As shown in FIG. 4, the limit sensors 174a each have a U-shaped section, as viewed from the direction Y, and are arranged in a position striding across the vertical portion of the X-direction target 171b. The limit sensor 174a on the first fixed frame 131 (fourth fixed frame 134) is so configured that the vertical portion of the X-direction target 171b is arranged inside the limit sensor 174a, and a laser beam is blocked when the movable table 11 reaches the movable limit position on the Y1 side (Y2 side). Thus, it can be detected that the movable table 11 has reached the movable limit position in the direction Y. Furthermore, the X-direction target 171b for the X-direction gap sensors 171a is employed as a laser beam blocking member, whereby no blocking member of the limit sensor 174a may be provided separately, and hence the number of components can be inhibited from increase. Thus, the weight of the movable table 11 can be inhibited from increase.

As shown in FIGS. 1 to 3, the laser interferometer system 18 is constituted by a laser emitting apparatus 181, a laser interferometer 182, an XZ-direction reflective mirror 183 (see FIG. 3), and a Y-direction reflective mirror 184 (see FIG. 3). The laser interferometer system 18 can detect displacement of the movable table 11 with accuracy higher than the accuracy of detection of the displacement by the aforementioned X-direction gap sensors 171a, Y-direction sensor head 172a, and Z-direction gap sensors 173a. Therefore, according to the first embodiment, the X-direction gap sensors 171a, Y-direction sensor head 172a, and Z-direction gap sensors 173a detect displacement of the movable table 11 when the movable table 11 is moved to an exposure start position, and the laser interferometer system 18 detects displacement of the movable table 11 during exposure. The laser interferometer system 18 is configured to be capable of detecting displacement of the movable table 11 in the direction X, the direction Y, and the direction Z.

The laser emitting apparatus 181 has a function of emitting a laser beam travelling along a path shown by a two-dot chain line in FIG. 1. The laser interferometer 182 includes an X-direction interferometer 182a, a Y-direction interferometer 182b, and a Z-direction interferometer 182c. The X-direction interferometer 182a emits a laser beam in the direction X1, as shown by the two-dot chain line in FIG. 1, so that the same emits a laser beam to the surface on the X2 side of the XZ-direction reflective mirror 183 (see FIGS. 3 and 4)

mounted on the movable table 11 to detect displacement of the movable table 11 in the direction X. The Y-direction interferometer 182b emits a laser beam in the direction Y2, as shown by the two-dot chain line in FIG. 1, so that the same emits a laser beam to the surface on the Y1 side of the Y-direction reflective mirror 184 (see FIGS. 3 and 4) mounted on the movable table 11 to detect displacement of the movable table 11 in the direction Y. The Z-direction interferometer 182c emits a laser beam in the direction X1, as shown by the two-dot chain line in FIG. 1, so that the same emits a laser beam to the surface on the Z2 side of the XZ-direction reflective mirror 183 (see FIGS. 3 and 4) mounted on the movable table 11 through an unshown mirror reflecting a laser beam in the direction Z1 to detect displacement of the movable table 11 in the direction Z. The laser interferometer 182 (182a to 182c) is configured to emit a laser beam to the movable table 11 from the outside of the stage apparatus 1, as shown in FIG. 1. The laser emitting apparatus 181 and the laser interferometer 182 are placed on the anti-vibration table 3 for a laser interferometer provided separately from the anti-vibration table 2 for a stage apparatus supporting the stage apparatus 1. In other words, vibration is not transmitted from the stage apparatus 1 to the laser emitting apparatus 181 and the laser interferometer 182 (182a to 182c). Thus, displacement can be measured with higher accuracy.

The XZ-direction reflective mirror 183 is formed to extend in the direction Y. Furthermore, the XZ-direction reflective mirror 183 is provided outside the side wall portion 113 of the movable table 11 on the X2 side, as shown in FIGS. 3 to 5. In addition, the XZ-direction reflective mirror 183 is arranged at a position lower than the height of the center of the horizontal divider 111 in the vertical direction (direction Z). On the other hand, according to the first embodiment, the linear scale target 172b having a weight larger than that of the X-direction target 171b is arranged on the X1 side while the X-direction target 171b and the linear scale target 172b are arranged at positions higher than the horizontal divider 111, as described above. Thus, the weight balances in the direction X and the direction Z can be inhibited from being extremely shifted to one side, and hence the position of the center of gravity of the movable table 11 can be easily arranged at the intersection portion of the horizontal divider 111 and the vertical divider 112.

The Y-direction reflective mirror 184 is mounted on the end portion on the Y1 side of the horizontal divider 111 of the movable table 11, as shown in FIGS. 3 to 6. Furthermore, the Y-direction reflective mirror 184 is arranged at the central portion of the horizontal divider 111 in the direction X. In other words, the Y-direction reflective mirror 184 is arranged at a position overlapping the center of gravity of the movable table 11 located at the intersection portion of the horizontal divider 111 and the vertical divider 112, as viewed from the direction Y.

The stage apparatus 1 is provided with stopper function portions 19 to limit the operating range of the movable table 11 in the direction X and the direction Z, as shown in FIG. 4. Specifically, the stopper function portions 19 are constituted by stopper movable elements 191 mounted on the movable table 11 and stopper stators 192 mounted on the stage fixed portion 12. The stopper movable elements 191 are provided on the four flange portions 114 of the movable table 11, as shown in FIGS. 3 to 5. These stopper movable elements 191 are mounted on the end portions on the Y1 side (Y2 side) of the flange portions 114 in the direction Y1 (direction Y2) to protrude outward in the direction X. In other words, the four stopper movable elements 191 are provided at the four corners of the movable table 11 to protrude outward in the direction X. More specifically, the four stopper movable elements 191 are arranged outside the linear motor movable elements 151b to 154b (151c to 154c) of the four linear motors 151 to 154 and outside the levitation unit movable elements 141 of the four magnetic levitation units 14 in the direction X and the direction Y. The stopper function portions 19 are examples of the "stopper portion".

The two stopper stators 192 are mounted on the inner surface of each of a pair of side wall portions 121 of the stage fixed portion 12, as shown in FIG. 4. The four stopper stators 192 are arranged in positions corresponding to the four stopper movable elements 191. The stopper stators 192 each have a U-shaped section, as viewed from the direction Y, and are configured to surround the corresponding stopper movable elements 191 at prescribed intervals from outside. Distances between the stopper movable elements 191 and the stopper stators 192 are set at such distances that the stopper movable elements 191 and the stopper stators 192 come into contact with each other before the movable elements and the stators of the magnetic levitation units 14 and the linear motor units 15 come into contact with each other. According to the first embodiment, as hereinabove described, the four stopper movable elements 191 are arranged outside the movable elements of the magnetic levitation units 14 and the linear motor units 15, and hence the amount of displacement (moving distance) of each of the four stopper movable elements 191 becomes equal to or more than the amount of displacement (moving distance) of each of the movable elements of the magnetic levitation units 14 and the linear motor units 15 when the movable table 11 operates with six degrees of freedom. Therefore, the distances between the stopper movable elements 191 and the stopper stators 192 can be easily set at such distances that the stopper movable elements 191 and the stopper stators 192 come into contact with each other before the movable elements and the stators of the magnetic levitation units 14 and the linear motor units 15 come into contact with each other. The stopper stators 192 are formed to extend in the direction Y, and configured to be capable of accommodating movement of the movable table 11 in the direction Y.

The anti-vibration table 2 for a stage apparatus is provided to support the stage apparatus 1, as shown in FIGS. 1 and 2. The anti-vibration table 2 for a stage apparatus has a rectangular shape in plan view, and includes leg portions at four corners. Furthermore, the anti-vibration table 2 for a stage apparatus has a function of preventing vibration from being transmitted to the stage apparatus 1 from outside and a function of preventing vibration from being transmitted from the stage apparatus 1 to outside.

The anti-vibration table 3 for a laser interferometer is provided to support the laser emitting apparatus 181 and the laser interferometer 182 (182a to 182c) of the laser interferometer system 18, as shown in FIGS. 1 and 2. The anti-vibration table 3 for a laser interferometer is U-shaped in plan view, and arranged to surround the Y1 side of the anti-vibration table 2 for a stage apparatus. Furthermore, the anti-vibration table 3 for a laser interferometer is arranged at a prescribed interval from the anti-vibration table 2 for a stage apparatus. In addition, the anti-vibration table 3 for a laser interferometer has a function of preventing vibration from being transmitted to the laser emitting apparatus 181 and the laser interferometer 182 (182a to 182c) from outside and a function of preventing vibration from being transmitted from the laser emitting apparatus 181 and the laser interferometer 182 (182a to 182c) to outside.

Next, the operation of the movable table 11 of the stage apparatus 1 according to the first embodiment is described.

At the time when the stage apparatus 1 is started, the movable table 11 is in a state where the lower surfaces of the stopper movable elements 191 arranged at the four corners come into contact with the inner surfaces of the stopper stators 192 and the stopper movable elements 191 are placed on the stopper stators 192. From this state, the magnetic levitation units 14 are driven to magnetically levitate the movable table 11 to a prescribed levitation origin position in the range of movement. Thereafter, the four linear motors 151 to 154 are driven to operate the movable table 11 in the direction Y which is a scanning direction of exposure. At this time, the thrust of the magnetic levitation units 14 in the four flange portions 114 is controlled to operate the movable table 11 so that the same takes a prescribed posture. In other words, the linear motors 151 to 154 and the magnetic levitation units 14 are controlled to operate the movable table 11 in the six directions of the direction X, the direction Y, the direction Z, the direction about the X axis ($\theta x$), the direction about the Y axis ($\theta y$), and the direction about the Z axis ($\theta z$). Furthermore, the thrust of the four linear motors 151 to 154 can be controlled to operate the movable table 11 in the direction about the Z axis ($\theta z$). Thus, according to the first embodiment, the movable table 11 can be operated with six degrees of freedom.

According to the first embodiment, as hereinabove described, the linear motor units 15 to operate the movable table 11 in the direction Y are provided, and the linear motor movable elements 151b to 154b (151c to 154c) and the linear motor stators 151a to 154a of the linear motor units 15 are arranged inside the movable table 11. Thus, no arrangement space for the linear motor units 15 may be provided outside an arrangement space for the movable table 11, dissimilarly to a case where the linear motor movable elements 151b to 154b (151c to 154c) and the linear motor stators 151a to 154a are arranged outside the movable table 11, and hence the outside dimension of the stage apparatus 1 in the horizontal direction can be reduced. Consequently, the stage apparatus 1 can be downsized.

According to the first embodiment, as hereinabove described, the motor placement spaces 11a to 11d are provided in the internal portion of the movable table 11, and the linear motor movable elements 151b to 154b (151c to 154c) and the linear motor stators 151a to 154a are arranged in the motor placement spaces 11a to 11d in the internal portion of the movable table 11 to extend in the direction Y. Thus, the linear motor movable elements 151b to 154b (151c to 154c) and the linear motor stators 151a to 154a can be easily arranged inside the movable table 11 by providing the motor placement spaces 11a to 11d in the internal portion of the movable table 11, and hence the stage apparatus 1 can be easily downsized.

According to the first embodiment, as hereinabove described, the horizontal divider 111 extending in the horizontal direction through the center of gravity of the movable table 11 and the vertical divider 112 extending in the vertical direction through the center of gravity of the movable table 11 are provided, the internal portion of the movable table 11 is divided into the four latticed motor placement spaces 11a to 11d by the horizontal divider 111 and the vertical divider 112, and the linear motors 151 to 154 are arranged in the four motor placement spaces 11a to 11d, respectively, to surround the center of gravity of the movable table 11. Thus, the center of gravity of the movable table 11 is located at the center position of the four motor placement spaces 11a to 11d where the four linear motors 151 to 154 are arranged, and hence the resultant force (action center) of the thrust of the four linear motors 151 to 154 can be easily caused to act on the vicinity of the center of gravity of the movable table 11. Consequently, the operating accuracy of the movable table 11 can be easily improved. Furthermore, the horizontal divider 111 and the vertical divider 112 are provided so that the four motor placement spaces 11a to 11d are provided, and hence the movable table 11 can be reduced in weight. Thus, the operating accuracy of the movable table 11 can be improved while the movable table 11 is reduced in size and weight.

According to the first embodiment, as hereinabove described, the linear motors 151 to 154 are arranged in the four motor placement spaces 11a to 11d, respectively, to surround the center of gravity of the movable table 11 and to be centrally symmetric with respect to the center of gravity of the movable table 11, whereby the resultant force (action center) of the thrust from a plurality of linear motors 151 to 154 can be easily caused to act on the vicinity of the center of gravity of the movable table 11.

According to the first embodiment, as hereinabove described, the lower linear motor movable elements 151c and 152c are provided on the upper surface of the horizontal divider 111 of the movable table 11 to hold the vertical divider 112 therebetween, and the upper linear motor movable elements 153b and 154b are provided on the lower surface of the horizontal divider 111 of the movable table 11 to hold the vertical divider 112 therebetween. Furthermore, the linear motor stators 151a and 152a are arranged to be vertically opposed to the lower linear motor movable elements 151c and 152c, respectively, and the linear motor stators 153a and 154a are arranged to be vertically opposed to the upper linear motor movable elements 153b and 154b, respectively. Thus, the four linear motors 151 to 154 can be easily arranged in the four motor placement spaces 11a to 11d divided about the center of gravity of the movable table 11 by the horizontal divider 111 and the vertical divider 112 to be centrally symmetric with respect to the center of gravity of the movable table 11.

According to the first embodiment, as hereinabove described, the upper linear motor movable elements 151b and 152b are provided on the inner lower surface of the upper frame 116 to hold the vertical divider 112 therebetween and to be vertically opposed to the linear motor stators 151a and 152a, respectively. Furthermore, the lower linear motor movable elements 153c and 154c are provided on the inner upper surface of the lower frame 115 to hold the vertical divider 112 therebetween and to be vertically opposed to the linear motor stators 153a and 154a, respectively. Thus, the two linear motor movable elements can be arranged with respect to each of the linear motor stators 151a to 154a, and hence the thrust can be further increased as compared with a case where only one linear motor movable element is provided with respect to each of the linear motor stators 151a to 154a. Consequently, the thrust in the direction Y to the movable table 11 can be further increased while the resultant force (action center) of the thrust of the four linear motors 151 to 154 arranged in the four latticed motor placement spaces 11a to 11d divided about the center of gravity of the movable table 11 is caused to act on the vicinity of the center of gravity of the movable table 11. According to the first embodiment, as hereinabove described, the lower frame 115 and the upper frame 116 each are formed to have a length shorter than that of the horizontal divider 111 in the direction Y, whereby the lower frame 115 and the upper frame 116 can be reduced in weight, and hence the overall movable table 11 can be reduced in weight.

According to the first embodiment, as hereinabove described, the stage fixed portion 12 supporting the linear motor stators 151a to 154a is provided outside the movable table 11, whereby the linear motor stators 151a to 154a can be stably supported by the stage fixed portion 12, and hence the movable table 11 can be accurately operated in the direction Y along the stably supported linear motor stators 151a to 154a.

According to the first embodiment, as hereinabove described, the movable portion main frame constituted by the horizontal divider 111, the vertical divider 112, the side wall portions 113, and the flange portions 114 is integrally formed of a ceramic member, whereby the movable portion main frame is formed of a ceramic member having high specific stiffness, and hence the specific stiffness of the overall movable table 11 can be increased. Thus, the movable table 11 can be inhibited from being deformed by the thrust of the magnetic levitation units 14 and the linear motor units 15, and hence the movable table 11 can be accurately operated. The lightweight ceramic member is employed, whereby the overall movable table 11 is reduced in weight, and the movable table 11 can be operated by smaller thrust. Thus, the magnetic levitation units 14 and the linear motor units 15 can be downsized, and hence the stage apparatus 1 can be downsized.

According to the first embodiment, as hereinabove described, the magnetic levitation units 14 that is magnetically levitated is provided, whereby air gaps (intervals) between the levitation unit movable elements 141 and the levitation unit stators 142 can be increased as compared with a case where air bearings having very small air gaps are employed. Thus, contact of the levitation unit movable elements 141 with the levitation unit stators 142 can be avoided so that the movable table 11 can be operated at high speed, even if the size of the intervals between the levitation unit movable elements 141 and the levitation unit stators 142 varies when the movable table 11 is operated at high speed and high acceleration. Furthermore, no apparatus, plumbing installation, or the like to supply air may be provided, dissimilarly to a case where air bearings are employed, and hence the stage apparatus 1 can be further downsized.

According to the first embodiment, as hereinabove described, the four magnetic levitation units 14 are arranged to surround the center of gravity of the movable table 11 in plan view, whereby the resultant force (action center) of the thrust of the four magnetic levitation units 14 can be easily caused to act on the vicinity of the center of gravity of the movable table 11, and hence the operating accuracy of the movable table 11 can be easily improved.

According to the first embodiment, as hereinabove described, the magnetic levitation units 14 are mounted on the flange portions 114 provided to protrude to the outside of the movable table 11, whereby the magnetic levitation units 14 can be easily arranged outside the motor placement spaces 11a to 11d of the movable table 11 where the linear motor units 15 are arranged.

According to the first embodiment, as hereinabove described, the flange portions 114 are so formed that the vertical heights thereof gradually increase from the forward ends toward the bases, whereby the section stiffness of the flange portions 114 in the vicinity of the bases can be increased, and hence the flange portions 114 can be inhibited from warping in the vertical direction. Consequently, the magnetic levitation units 14 mounted on the flange portions 114 can more stably operate the movable table 11 in the direction Z.

According to the first embodiment, as hereinabove described, the magnetic levitation units 14 are configured to be capable of being driven in the direction X in the horizontal plane orthogonal to the direction Y as well as being driven in the vertical direction (direction Z), whereby the magnetic levitation units 14 can operate the movable table 11 both in the direction X and in the direction Z, and hence a drive unit to operate the movable table 11 in the direction Z and a drive unit to operate the same in the direction X may not be provided individually. Thus, the linear motor units 15 and the magnetic levitation units 14 enable six-degree-of-freedom driving in the direction X, the direction Y, the direction Z, the direction about the X axis ($\theta x$), the direction about the Y axis ($\theta y$), and the direction about the Z axis ($\theta z$) while the stage apparatus 1 is downsized.

According to the first embodiment, as hereinabove described, the position of the center of gravity of the movable table 11, the action center position of the thrust in the direction Y of the linear motor units 15, and the action center position of the thrust in the direction X of the magnetic levitation units 14 are positioned at the same height in the vertical direction, whereby the thrust in the direction Y of the linear motor units 15 can inhibit generation of the moment about the axis in the direction X while the thrust in the direction X of the magnetic levitation units 14 can inhibit generation of the moment about the axis in the direction Y. Thus, it is not necessary to control the thrust in the vertical direction (direction Z) of the magnetic levitation units 14 to maintain the posture of the movable table 11, and hence it is not necessary to perform complicated control on the magnetic levitation units 14. Consequently, the movable table 11 can be stably operated in the direction X and the direction Y easily.

According to the first embodiment, as hereinabove described, the adjustment weight 116a to finely adjust the position of the center of gravity of the movable table 11 is provided, and the adjustment weight 116a is configured to be capable of performing a fine adjustment so that the position of the center of gravity of the movable table 11, the action center position of the thrust in the direction Y of the linear motor units 15, and the action center position of the thrust in the direction X of the magnetic levitation units 14 are positioned at the same height in the vertical direction. Thus, the adjustment weight 116a can accurately perform a fine adjustment so that the position of the center of gravity of the movable table 11, the action center position of the thrust in the direction Y of the linear motor units 15, and the action center position of the thrust in the direction X of the magnetic levitation units 14 are positioned at the same height, and hence the thrust in the direction Y of the linear motor units 15 can inhibit generation of the moment about the axis in the direction X while the thrust in the direction X of the magnetic levitation units 14 can inhibit generation of the moment about the axis in the direction Y. Consequently, the movable table 11 can be more stably operated in the direction X and the direction Y.

According to the first embodiment, as hereinabove described, the stopper function portions 19 each limiting the operating range of the movable table 11 are provided, whereby the stopper function portions 19 can inhibit contact of the levitation unit movable elements 141 with the levitation unit stators 142 and contact of the linear motor movable elements 151b to 154b (151c to 154c) with the linear motor stators 151a to 154a, and hence the magnetic levitation units 14 and the linear motor units 15 can be inhibited from breakage.

(Second Embodiment)

Figure 7:
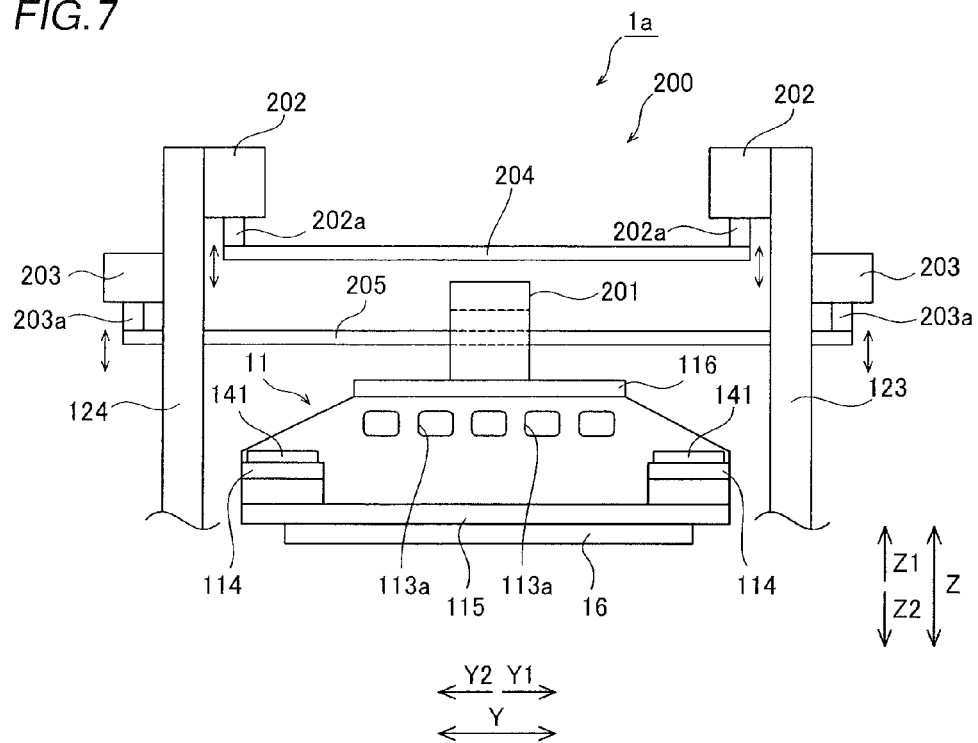
FIG. 7 is a schematic diagram for illustrating the structure of a levitation auxiliary mechanism of a stage apparatus according to a second embodiment.
Figure 8:
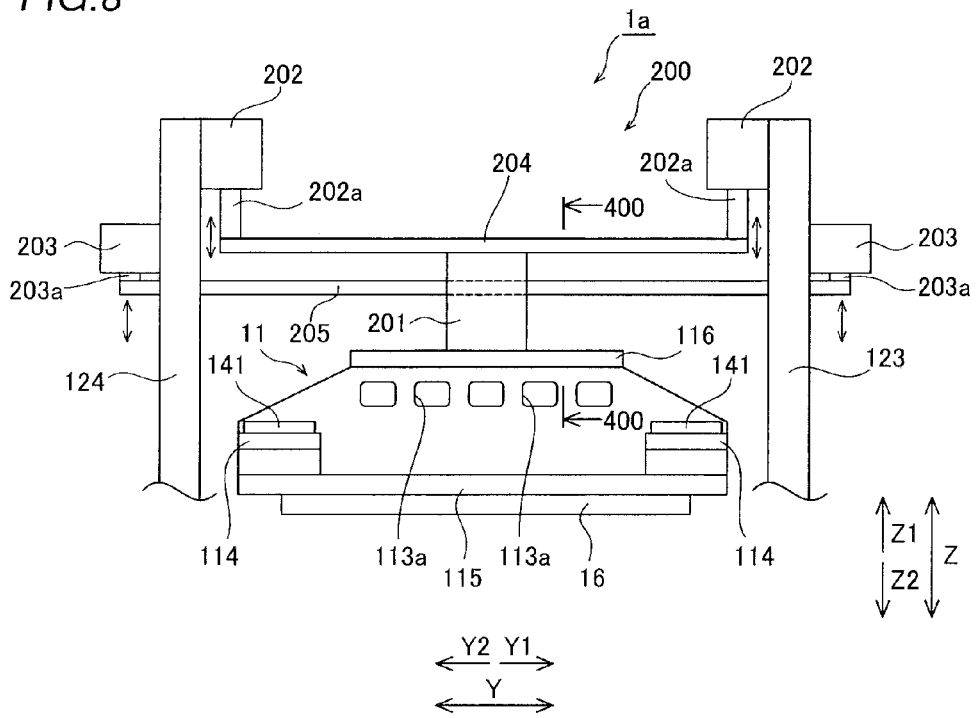
FIG. 8 is a schematic diagram for illustrating the operation of the levitation auxiliary mechanism of the stage apparatus according to the second embodiment.
Figure 9:
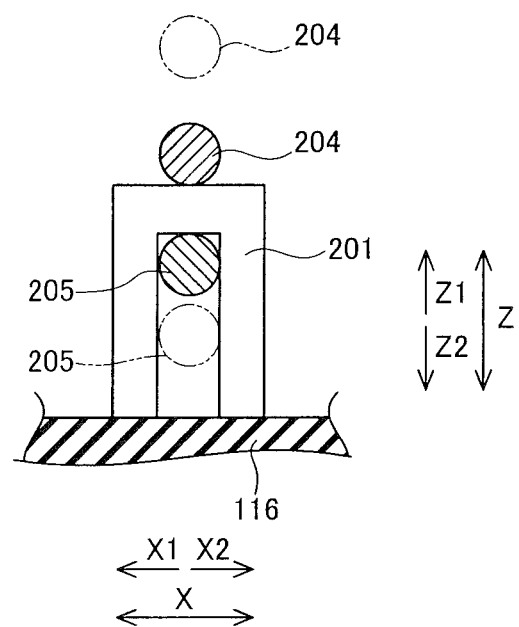
FIG. 9 is a sectional view taken along the line 400-400 in FIG. 8.

Next, a second embodiment is described with reference to FIGS. 7 to 9. In this second embodiment, the structure in which upon start-up of a stage apparatus 1a, a movable table 11 is moved from the outside of the range of movement to the vicinity of a prescribed levitation origin position in the range of movement by a levitation auxiliary mechanism 200 shown in FIG. 7 is described, dissimilarly to the aforementioned first embodiment. The structure of the movable table 11 according to the second embodiment is identical to that of the movable table 11 according to the aforementioned first embodiment.

The stage apparatus 1a according to the second embodiment includes the levitation auxiliary mechanism 200 to move the movable table 11 from the outside of the range of movement to the vicinity of the prescribed levitation origin position in the range of movement, as shown in FIG. 7. The levitation auxiliary mechanism 200 includes a levitation origin auxiliary member 201, a pair of upper linear actuators 202, a pair of lower linear actuators 203, an upper bar 204, and a lower bar 205.

The levitation origin auxiliary member 201 is provided on the upper surface of the movable table 11. This levitation origin auxiliary member 201 has an inverted U-shaped section (see FIG. 9) holding the lower bar 205, as viewed from a direction Y, and is so placed that both lower end portions (two lower end portions of the inverted-U shape) thereof come into contact with the upper surface of an upper frame 116 of the movable table 11. The levitation origin auxiliary member 201 is placed in the vicinity of a central portion of the upper frame 116.

The pair of upper linear actuators 202 are mounted on the inner surface (surface in the direction Y2) of a front surface portion 123 of a stage fixed portion 12 and the inner surface (surface in the direction Y1) of a rear surface portion 124 of the stage fixed portion 12. Furthermore, the pair of upper linear actuators 202 are placed in the vicinity of an upper end portion of the front surface portion 123 of the stage fixed portion 12 and an upper end portion of the rear surface portion 124 of the stage fixed portion 12. Output shafts 202a capable of being driven in a direction Z are provided on lower portions of the upper linear actuators 202. The upper bar 204 extending in the direction Y is mounted on lower end portions of the two output shafts 202a. The upper bar 204 is arranged above the levitation origin auxiliary member 201.

The pair of lower linear actuators 203 are mounted on the outer surface (surface in the direction Y1) of the front surface portion 123 of the stage fixed portion 12 and the outer surface (surface in the direction Y2) of the rear surface portion 124 of the stage fixed portion 12. The pair of lower linear actuators 203 are arranged below (Z2 side) the upper linear actuators 202. Output shafts 203a capable of being driven in the direction Z are provided on lower portions of the lower linear actuators 203. The lower bar 205 extending in the direction Y is mounted on lower end portions of the two output shafts 203a. The lower bar 205 is provided to pass through the inside of an inverted U-shaped portion of the levitation origin auxiliary member 201.

Next, the operation to move the movable table 11 to the vicinity of the prescribed levitation origin position in the range of movement with the levitation auxiliary mechanism 200 is described with reference to FIGS. 4 and 7 to 9.

At the time when the stage apparatus 1a is started, the movable table 11 is in a state where the same is placed on stopper stators 192 (see FIG. 4). In this state, the upper bar 204 and the lower bar 205 are separated from the levitation origin auxiliary member 201, as shown in FIG. 7. Then, the pair of upper linear actuators 202 are driven to operate the upper bar 204 downward and bring the upper bar 204 into contact with the upper surface of the levitation origin auxiliary member 201, as shown in FIGS. 8 and 9. Then, the pair of lower linear actuators 203 are driven to operate the lower bar 205 upward and bring the lower bar 205 into contact with the inner upper end surface of the inverted U-shaped portion of the levitation origin auxiliary member 201. At this time, the output of the lower linear actuators 203 is made larger than the output of the upper linear actuators 202 thereby lifting the movable table 11 upward. Then, the movable table 11 is moved to the vicinity of the preset prescribed levitation origin position.

Thereafter, magnetic levitation units 14 are driven, and the upper linear actuators 202 and the lower linear actuators 203 are driven, whereby the upper bar 204 and the lower bar 205 are separated from the levitation origin auxiliary member 201. Thus, the stage apparatus 1a is returned to the state in FIG. 7, and the movable table 11 located in the vicinity of the prescribed levitation origin position can be easily operated to the prescribed levitation origin position by the thrust from the magnetic levitation units 14. The upper bar 204 and the lower bar 205 separated from the levitation origin auxiliary member 201 are moved to positions not coming into contact with the levitation origin auxiliary member 201 when the movable table 11 moves in the range of movement.

The remaining structure of the second embodiment is similar to that of the aforementioned first embodiment.

According to the second embodiment, as hereinabove described, the levitation auxiliary mechanism 200 levitating the movable table 11 to the vicinity of the levitation origin position set in the range of movement of the movable table 11 is provided, whereby the movable table 11 can be levitated from the outside of the range of movement to the inside (vicinity of the levitation origin position) of the range of movement by the levitation auxiliary mechanism 200 without employing the magnetic levitation units 14, and hence the magnetic levitation units 14 can be employed in only driving in the range of movement. Thus, it is not necessary to increase the drive distances of the magnetic levitation units 14, dissimilarly to a case where the movable table 11 is levitated from the outside of the range of movement to the inside of the range of movement by the magnetic levitation units 14, and hence it is not necessary to increase the thrust generated in the magnetic levitation units 14. Consequently the magnetic levitation units 14 can be downsized. Furthermore, even if a trouble occurs in the stage apparatus 1a and levitation unit movable elements 141 and levitation unit stators 142 of the magnetic levitation units 14 abnormally attract each other, the upper bar 204 is moved downward (in the direction Z2) by the upper linear actuators 202 to push the upper surface of the levitation origin auxiliary member 201 downward, whereby the movable table 11 can be placed on the stopper stators 192 (see FIG. 4). In other words, the movable table 11 can be returned to an initial position by the operation of the levitation auxiliary mechanism 200 not by hand.

The remaining effects of the second embodiment are similar to those of the aforementioned first embodiment.

The embodiments disclosed this time must be considered as illustrative in all points and not restrictive. The range of the present invention is shown not by the above description of the embodiments but by the scope of claims for patent, and all modifications within the meaning and range equivalent to the scope of claims for patent are included.

For example, while the example of applying the stage apparatus to the magnetic levitation table apparatus employed in the exposure apparatus has been shown in each of the aforementioned first and second embodiments, the present invention is not restricted to this. The stage apparatus may be applied to an apparatus employed for a purpose other than the exposure apparatus.

While the example of configuring the movable table to hold the mask as the sample has been shown in each of the aforementioned first and second embodiments, the present invention is not restricted to this. The movable table may be configured to hold a sample other than the mask.

While the example of the structure of providing the four linear motors 151 to 154 has been shown in each of the aforementioned first and second embodiments, the present invention is not restricted to this. Only one linear motor may be provided, or a plurality other than four of linear motors may be provided.

While the example of forming the linear motor movable elements of permanent magnets and forming the linear motor stators of coils has been shown in each of the aforementioned first and second embodiments, the present invention is not restricted to this. The linear motor stators may be formed of permanent magnets, and the linear motor movable elements may be formed of coils.

While the example of the structure of providing the four levitation unit movable elements has been shown in each of the aforementioned first and second embodiments, the present invention is not restricted to this. Only one levitation unit movable element may be provided, or a plurality other than four of levitation unit movable elements may be provided.

While the example of forming the levitation unit movable elements of permanent magnets and forming the levitation unit stators of coils has been shown in each of the aforementioned first and second embodiments, the present invention is not restricted to this. The levitation unit stators may be formed of permanent magnets, and the levitation unit movable elements may be formed of coils.

While the magnetic levitation units capable of operating the movable table both in the direction X and in the direction Z have been shown as the examples of the levitation unit in each of the aforementioned first and second embodiments, the present invention is not restricted to this. Levitation units capable of operating the movable table only in the direction Z may be employed.

While the example of the structure of providing the motor placement spaces in the internal portion of the movable table and arranging the linear motors in the motor placement spaces has been shown in each of the aforementioned first and second embodiments, the present invention is not restricted to this. The linear motors may not be arranged in the internal portion of the movable table so far as the same are arranged inside the movable table in plan view.

While the example of dividing the motor placement space into four spaces by the horizontal divider and the vertical divider has been shown in each of the aforementioned first and second embodiments, the present invention is not restricted to this. The motor placement space may not be divided, or the motor placement space may be divided into a plurality other than four of spaces. In this case, the linear motors may be placed in a number corresponding to the number of divided spaces.

While the example of dividing the rectangular motor placement space formed by the lower frame 115, the upper frame 116, and the pair of side wall portions 113 serving as the frame-shaped portion into four spaces of two stages in the vertical direction and two rows in the direction X by the horizontal divider and the vertical divider has been shown in each of the aforementioned first and second embodiments, the present invention is not restricted to this. Two dividers may be provided to connect the opposing corners of the rectangular motor placement space so that the motor placement space is divided into four spaces.

While the example of the structure of providing the two linear motor movable elements with respect to each of the linear motor stators has been shown in each of the aforementioned first and second embodiments, the present invention is not restricted to this. One linear motor movable element may be provided with respect to each of the linear motor stators, or three or more linear motor movable elements may be provided with respect to each of the linear motor stators.

While the stopper function portions 19 each limiting the operating range in the direction X and the direction Z have been shown as the examples of the stopper portion in each of the aforementioned first and second embodiments, the present invention is not restricted to this. A stopper portion limiting the operating range in the direction X and a stopper portion limiting the operating range in the direction Z may be provided separately.

While the structure in which the upper frame and the lower frame each have a length shorter than that of the horizontal divider has been shown in each of the aforementioned first and second embodiments, the present invention is not restricted to this. At least either the upper frame or the lower frame may have a length shorter than that of the horizontal divider.

What is claimed is:

1. A stage apparatus comprising:
a movable table to hold a sample;
a levitation unit to operate the movable table at least in a vertical direction, including a levitation unit movable element and a levitation unit stator; and
a linear motor to operate the movable table in a first horizontal direction in a horizontal plane, including a linear motor movable element arranged inside the movable table and a linear motor stator arranged inside the movable table,
wherein a motor placement space is provided in an internal portion of the movable table,
wherein the movable table includes a horizontal divider extending in a horizontal direction through a center of gravity of the movable table and a vertical divider extending in the vertical direction through the center of gravity of the movable table,
wherein the motor placement space in the movable table is divided into four spaces by the horizontal divider and the vertical divider, and
wherein linear motors each including the linear motor movable element and the linear motor stator are arranged in the respective four spaces.

2. The stage apparatus according to claim 1, wherein
the linear motor movable element and the linear motor stator are arranged in the motor placement space in the internal portion of the movable table to extend in the first horizontal direction.

3. The stage apparatus according to claim 2, wherein the linear motors each including the linear motor movable element and the linear motor stator are arranged in the motor placement space in the internal portion of the movable table to surround the center of gravity of the movable table.

4. The stage apparatus according to claim 3, wherein
the linear motors each including the linear motor movable element and the linear motor stator are arranged in the respective four spaces to surround the center of gravity of the movable table and to be centrally symmetric with respect to the center of gravity of the movable table.

5. The stage apparatus according to claim 3, wherein
the linear motor movable element includes a first linear motor movable element and a second linear motor movable element placed on an upper surface of the horizontal divider of the movable table to hold the vertical divider therebetween and a third linear motor movable element and a fourth linear motor movable element placed on a lower surface of the horizontal divider of the movable table to hold the vertical divider therebetween, and the linear motor stator includes a first linear motor stator and a second linear motor stator arranged to be opposed to the first linear motor movable element and the second linear motor movable element in the vertical direction, respectively and a third linear motor stator and a fourth linear motor stator arranged to be opposed to the third linear motor movable element and the fourth linear motor movable element in the vertical direction, respectively.

6. The stage apparatus according to claim 5, wherein the movable table further includes a frame-shaped portion provided to surround an outer edge of the horizontal divider and an outer edge of the vertical divider, a space surrounded by the frame-shaped portion constitutes the motor placement space, and is divided into four latticed spaces by the horizontal divider and the vertical divider, the linear motor movable element further includes a fifth linear motor movable element and a sixth linear motor movable element placed on an inner lower surface of the frame-shaped portion to hold the vertical divider therebetween and arranged to be opposed to the first linear motor stator and the second linear motor stator in the vertical direction, respectively, and a seventh linear motor movable element and an eighth linear motor movable element placed on an inner upper surface of the frame-shaped portion to hold the vertical divider therebetween and arranged to be opposed to the third linear motor stator and the fourth linear motor stator in the vertical direction, respectively, and the first linear motor stator, the first linear motor movable element, and the fifth linear motor movable element constitutes a first linear motor of the linear motors, the second linear motor stator, the second linear motor movable element, and the sixth linear motor movable element constitutes a second linear motor of the linear motors, the third linear motor stator, the third linear motor movable element, and the seventh linear motor movable element constitutes a third linear motor of the linear motors, and the fourth linear motor stator, the fourth linear motor movable element, and the eighth linear motor movable element constitutes a fourth linear motor of the linear motors.

7. The stage apparatus according to claim 1, wherein the movable table further includes a frame-shaped portion provided to surround an outer edge of the horizontal divider and an outer edge of the vertical divider, the frame-shaped portion includes an upper frame located parallel to and above the horizontal divider and a lower frame located parallel to and below the horizontal divider, and at least either the upper frame or the lower frame has a length shorter than that of the horizontal divider in the first horizontal direction.

8. The stage apparatus according to claim 1, wherein the linear motor stator is arranged to pass through the movable table and extend in the first horizontal direction to an outside of the movable table, the stage apparatus further comprising a stator supporting member supporting the linear motor stator outside the movable table.

9. The stage apparatus according to claim 1, wherein the movable table includes a movable portion main frame having a first portion constituting a motor placement space to place the linear motor and a second portion to arrange the levitation unit, and the first portion and the second portion of the movable portion main frame are integrally formed.

10. The stage apparatus according to claim 9, wherein the first portion and the second portion of the movable portion main frame are integrally formed of a ceramic member.

11. The stage apparatus according to claim 1, wherein the levitation unit is magnetically levitated, and arranged outside the movable table.

12. The stage apparatus according to claim 11, wherein a plurality of the levitation units each including the levitation unit movable element and the levitation unit stator are arranged to surround the center of gravity of the movable table in plan view.

13. The stage apparatus according to claim 11, wherein the levitation unit is mounted on a protrusion portion provided to protrude to an outside of the movable table.

14. The stage apparatus according to claim 1, wherein the levitation unit is configured to be capable of being driven in a second horizontal direction in the horizontal plane orthogonal to the first horizontal direction as well as being driven in the vertical direction.

15. The stage apparatus according to claim 14, wherein a position of the center of gravity of the movable table, an action center position of thrust in the first horizontal direction of the linear motor, and an action center position of thrust in the second horizontal direction of the levitation unit are positioned at the same height in the vertical direction.

16. The stage apparatus according to claim 1, further comprising a levitation auxiliary mechanism levitating the movable table to a vicinity of a levitation origin position set in a range of movement of the movable table upon start-up of the stage apparatus.

17. The stage apparatus according to claim 1, further comprising a stopper portion limiting a range of movement of the movable table.

18. A stage apparatus comprising:
a movable table to hold a sample;
a levitation unit to operate the movable table at least in a vertical direction, including a levitation unit movable element and a levitation unit stator; and
a linear motor to operate the movable table in a first horizontal direction in a horizontal plane, including a linear motor movable element arranged inside the movable table and a linear motor stator arranged inside the movable table,
wherein the levitation unit is magnetically levitated, and arranged outside the movable table,
wherein the levitation unit is mounted on a protrusion portion provided to protrude to an outside of the movable table, and
wherein the protrusion portion is so formed that a vertical height thereof gradually increases from a forward end thereof toward a base thereof.

19. A stage apparatus comprising:
a movable table to hold a sample;
a levitation unit to operate the movable table at least in a vertical direction, including a levitation unit movable element and a levitation unit stator; and
a linear motor to operate the movable table in a first horizontal direction in a horizontal plane, including a linear motor movable element arranged inside the movable table and a linear motor stator arranged inside the movable table,
wherein the levitation unit is configured to be capable of being driven in a second horizontal direction in the horizontal plane orthogonal to the first horizontal direction as well as being driven in the vertical direction,
wherein a position of a center of gravity of the movable table, an action center position of thrust in the first horizontal direction of the linear motor, and an action center position of thrust in the second horizontal direction of the levitation unit are positioned at the same height in the vertical direction,
further comprising an adjustment weight to finely adjust the position of the center of gravity of the movable table,
wherein the adjustment weight is configured to be capable of performing a fine adjustment so that the position of the center of gravity of the movable table, the action center position of the thrust in the first horizontal direction of the linear motor, and the action center position of the thrust in the second horizontal direction of the levitation unit are positioned at the same height in the vertical direction.

\* \* \* \* \*